(12) United States Patent
Van Pham et al.

(10) Patent No.: US 6,303,992 B1
(45) Date of Patent: Oct. 16, 2001

(54) INTERPOSER FOR MOUNTING SEMICONDUCTOR DICE ON SUBSTRATES

(75) Inventors: Cuong Van Pham, Belleville; Frank Burke DiPiazza, Highland; Jay DeAvis Baker, W. Bloomfield; Marc Alan Straub, Dearborn Heights; Vivek Amir Jairazbhoy, Farmington Hills, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/347,542

(22) Filed: Jul. 6, 1999

(51) Int. Cl.[7] .................................................. H01L 23/48
(52) U.S. Cl. ............................................ 257/734; 257/712
(58) Field of Search .................................... 257/734, 778, 257/786, 701, 673, 712, 713, 714, 721; 438/108

(56) References Cited

U.S. PATENT DOCUMENTS

| | | | |
|---|---|---|---|
| 3,917,370 | * 11/1975 | Thornton et al. | 339/16 R |
| 4,106,523 | * 8/1978 | Thornton et al. | 137/614.04 |
| 5,016,138 | * 5/1991 | Woodman | 361/381 |
| 5,022,462 | * 6/1991 | Flint et al. | 165/80.4 |
| 5,177,594 | 1/1993 | Chance et al. | 257/678 |
| 5,303,457 | 4/1994 | Falkner, Jr. et al. | 29/25.35 |
| 5,313,366 | 5/1994 | Gaudenzi et al. | 361/760 |
| 5,530,288 | 6/1996 | Stone | 257/700 |
| 5,681,757 | * 10/1997 | Hayes | 437/7 |
| 5,691,041 | 11/1997 | Frankeny et al. | 428/209 |
| 5,714,800 | 2/1998 | Thompson | 257/690 |
| 5,790,384 | 8/1998 | Ahmad et al. | 361/760 |
| 5,816,056 | 10/1998 | Ruffa | 62/119 |
| 5,962,924 | * 10/1999 | Wyland et al. | 257/778 |
| 5,973,391 | * 10/1999 | Bischoff et al. | 257/678 |
| 6,011,306 | * 1/2000 | Kimura | 257/734 |
| 6,049,124 | * 4/2000 | Raiser et al. | 257/712 |
| 6,093,963 | * 7/2000 | Chan et al. | 257/734 |
| 6,104,093 | * 8/2000 | Caletka et al. | 257/778 |

* cited by examiner

Primary Examiner—Don Wong
Assistant Examiner—Thuy Vinh Tran
(74) Attorney, Agent, or Firm—Mark Mollon

(57) ABSTRACT

An interposer 10 for electrically coupling a semiconductor die 50 to a substrate 70, comprising: an interposer body 12 made of a dielectric material and having a contact surface 14 and an opposed bonding surface 16; a plurality of contact pads 18 arranged about the periphery of the contact surface 14; a plurality of bonding pads 20 arranged across generally the entire area of the bonding surface 16; and a plurality of electrically conductive conduits 22 disposed generally within the interposer body, such that each conduit 22 connects a respective one of the contact pads 18 with a respective one of the bonding pads 20. The interposer 10 may also include: a sealed cooling channel 28 defined within the interposer body 12; a fluid medium 30 generally filling the cooling channel 28; and a piezoelectric element 26 attached to the interposer body such that the piezoelectric element communicates with the cooling channel 28 and the fluid medium 30, the piezoelectric element being operatively coupled to at least two of the electrically conductive conduits 22.

20 Claims, 3 Drawing Sheets

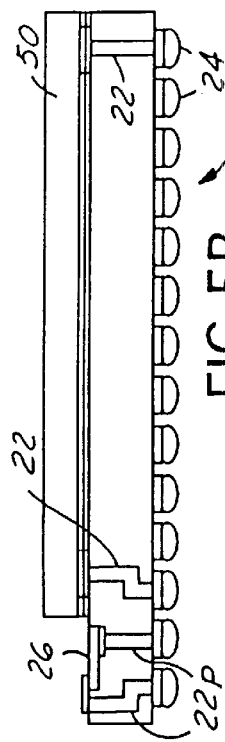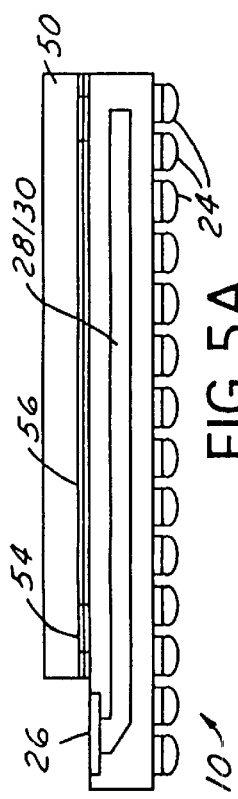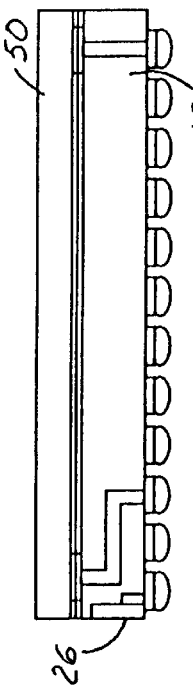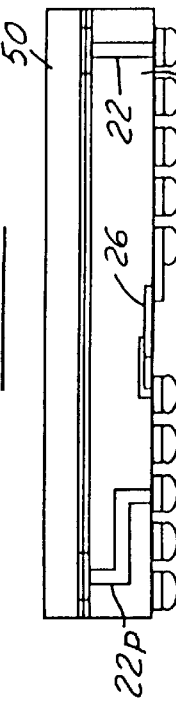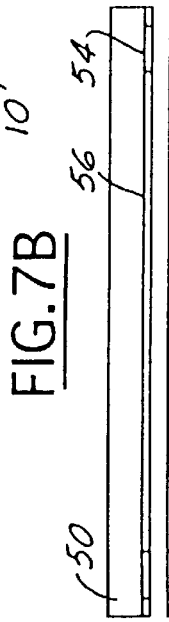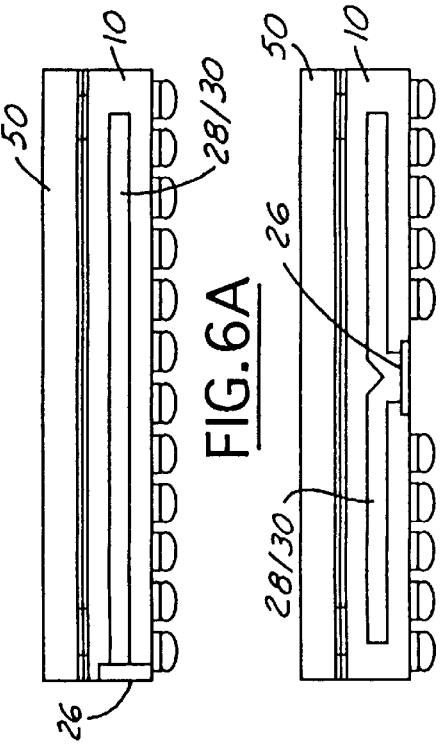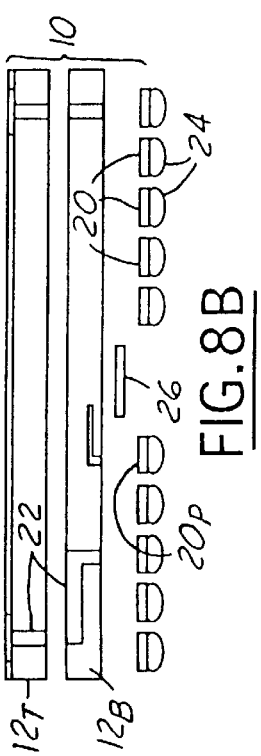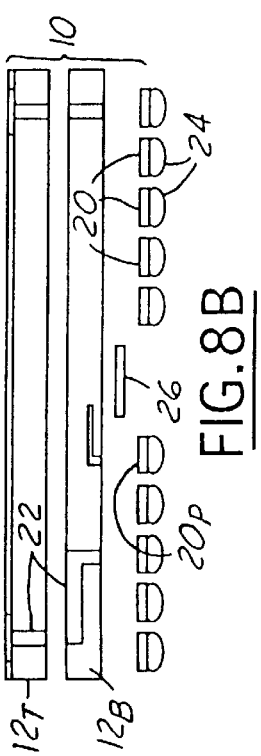

INTERPOSER FOR MOUNTING SEMICONDUCTOR DICE ON SUBSTRATES

BACKGROUND OF THE INVENTION

1. Field of the Invention

The present invention relates generally to integrated circuit (IC) components, such as semiconductor dice, and more particularly to interposers for mounting semiconductor dice on substrates.

2. Disclosure Information

In conventional flip-chip mounting processes, a semiconductor IC die 50 (see FIG. 1A) is typically "bumped", a process wherein thick metal layers (e.g., 25–100 microns) of gold or solder 24 are metallurgically bonded to the IC die's aluminum bond pads 54. The bumped IC die is then flipped "upside down" with the bumps 24 facing downward against mating mounting pads 72 on a substrate 70 (e.g., a printed circuit board), whereupon solder reflow (for solder bumps) or diffusion bonding (for gold bumps) is used to bond the bumps with their respective substrate mounting pads, as illustrated in FIG. 1B.

Because IC dies have traditionally been wire-bonded to leadframes and then encased in polymer or ceramic packages (as in DIPs, QFPs, etc.), the bond pads on an IC die are typically arranged about the periphery of the die's bonding surface (i.e., near the outer edge or perimeter of the die). This presents no problem for using flip-chip bonding so long as the die size is large, and/or the number of bond pads is low (thereby permitting the use of large pads); however, as the die size shrinks and/or the number of bond pads increases, the bond pads must be made smaller and/or more closely spaced (i.e., finer pitched), which makes registration and bonding of the bonding pads to the mounting pads much more difficult.

One way of addressing this problem has been to distribute the bond pads 24 across most of the entire face of the bonding surface (FIG. 2), rather than limiting the bond pads to the conventional perimeter locations (FIG. 1A). However, when the bond pads are brought inward from their typical perimeter locations toward the center of the bonding surface, they lie atop the transistors and other delicate solid state devices 52 located thereat, separated only by a thin passivation layer 56. This presents a problem because the heat and/or pressure required to melt or diffuse the bumps 24 (in order to form metallurgical bonds between the bond pads and mounting pads) often damages the adjacent/underlying transistors and IC devices 56. This problem has therefore limited flip-chip bonding, practically speaking, to the use of relatively low-temperature, low-pressure solder reflow processing with perimeter-only bond pad locations; but, as mentioned above, this places serious limits on the number of bond pads that can be used.

It would be desirable, therefore, to provide a way of enabling the use of a higher number of bond pads, without the aforementioned potential of damaging the delicate transistors and other IC devices.

SUMMARY OF THE INVENTION

The present invention overcomes the disadvantages of the prior art approaches by providing an interposer which enables connection of a semiconductor die to a substrate with the use of a high number (and/or larger sizes) of bond pads, without the aforementioned drawbacks. This interposer comprises: an interposer body made of a dielectric material and having a contact surface and an opposed bonding surface; a plurality of contact pads arranged about the periphery of the contact surface; a plurality of bonding pads arranged across generally the entire area of the bonding surface; and a plurality of electrically conductive conduits disposed generally within the interposer body, such that each conduit connects a respective one of the contact pads with a respective one of the bonding pads. The interposer may also include: a sealed cooling channel defined within the interposer body; a fluid medium generally filling the cooling channel; and a piezoelectric element attached to the interposer body such that the piezoelectric element communicates with the cooling channel and the fluid medium, the piezoelectric element being operatively coupled to at least two of the electrically conductive conduits.

It is an object and advantage that the interposer of the present invention enables the use of a higher number of bond pads, and/or larger bond pads, than would be provided using prior art approaches.

Another advantage is that the present invention enables the use of such larger and/or higher number of bond pads while greatly reducing the potential for damaging the delicate transistors and other IC devices of the semiconductor die.

Yet another advantage is that the piezoelectric element, cooling channels, and fluid medium cooperate to provide improved cooling for the attached semiconductor die.

These and other advantages, features and objects of the invention will become apparent from the drawings, detailed description and claims which follow.

BRIEF DESCRIPTION OF THE DRAWINGS

FIGS. 5A–B are side section views of a first interposer embodiment according to the present invention through a cooling channel thereof and through conductive conduits thereof, respectively.

FIGS. 6A–B are side section views of a second interposer embodiment according to the present invention through a cooling channel thereof and through conductive conduits thereof, respectively.

FIGS. 7A–B are side section views of a third interposer embodiment according to the present invention through a cooling channel thereof and through conductive conduits thereof, respectively.

FIGS. 8A–B are exploded side section views of the third interposer embodiment of FIGS. 7A–B, respectively.

DETAILED DESCRIPTION OF THE PREFERRED EMBODIMENTS

Figure 1A:
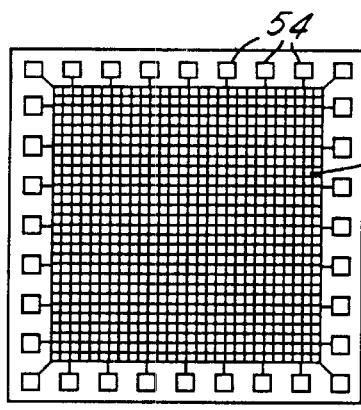
FIGS. 1A–B are top and side views, respectively, of a flip-chip having perimeter bond pads according to the prior art.
Figure 1B:
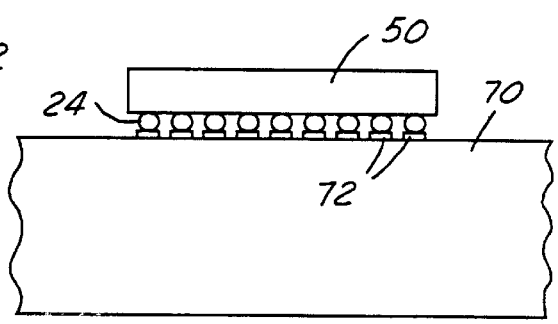
Figure 2:
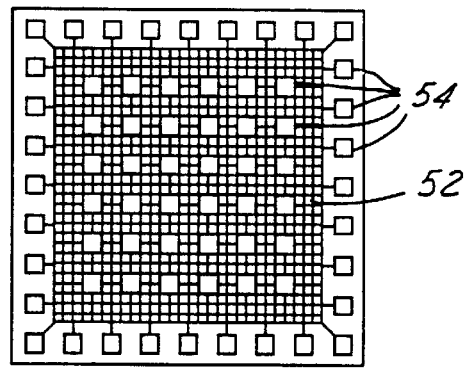
FIG. 2 is a top view of a flip-chip having bond pads distributed across an entire bonding surface thereof according to the prior art.
Figure 3A:
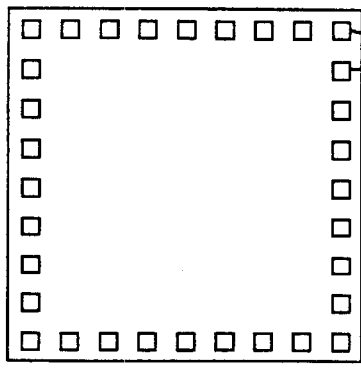
FIGS. 3A–B are top and bottom views, respectively, of an interposer for bonding a flip-chip to a substrate according to the present invention.
Figure 3B:
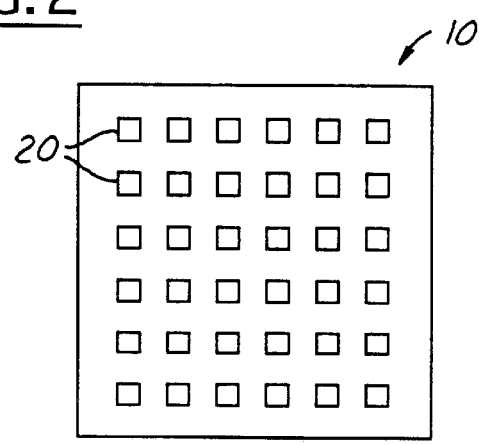
Figure 4:
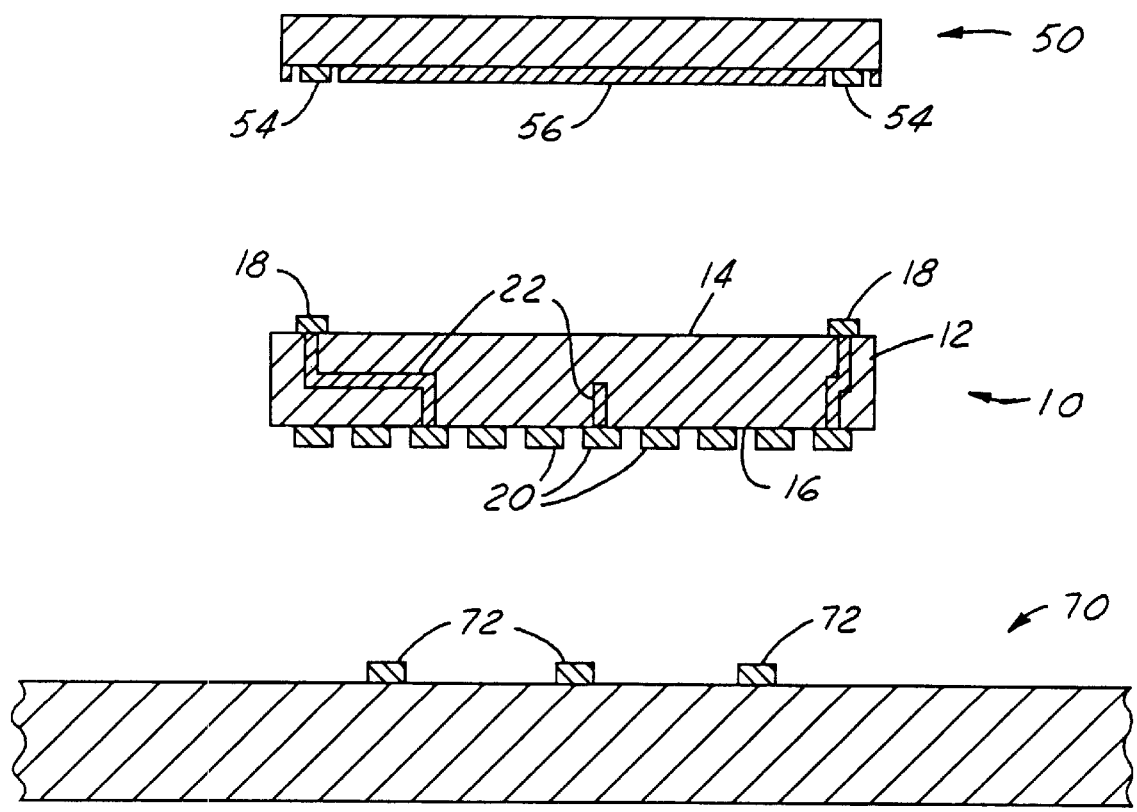
FIG. 4 is a side section view of an interposer, flip-chip, and substrate prior to bonding according to the present invention.

Referring now to the drawings, FIGS. 3–8 show an interposer 10 for electrically coupling a semiconductor die 50 to a substrate 70 according to the present invention. The interposer 10 comprises: an interposer body 12 made of a dielectric material and having a contact surface 14 and an opposed bonding surface 16; a plurality of contact pads 18 arranged about the periphery of the contact surface 14; a plurality of bonding pads 20 arranged across generally the entire area of the bonding surface 16; and a plurality of electrically conductive conduits 22 disposed generally within the interposer body, such that each conduit 22 connects a respective one of the contact pads 18 with a respective one of the bonding pads 20.

To assist the reader in understanding the present invention, all reference numbers used herein are summarized in the table below, along with the elements they represent:

- 10=Interposer
- 12=Body of interposer
- $12_T$=Top half of interposer body
- $12_B$=Bottom half of interposer body
- 14=Contact (top) surface of interposer body
- 16=Bonding (bottom) surface of interposer body
- 18=Contact pads on periphery of contact surface
- 20=Bonding pads on entire area of bonding surface
- $20_P$=Bonding pads connected to piezoelectric element
- 22=Electrically conductive conduits in interposer body
- $22_P$=Conduits connected to piezoelectric element
- 24=Interconnect metallizations on bonding pads
- 26=Piezoelectric element/acoustic generator
- 28=Cooling channel in interposer body
- 29=Opening in cooling channel for piezo-element
- 30=Fluid medium within cooling channel
- 50=Semiconductor die
- 52=IC portion of semiconductor die
- 54=Bond pads of semiconductor die
- 56=Passivation layer on semiconductor die
- 70=Substrate
- 72=Mounting pads on substrate
- 74=Circuit traces on substrate Preferably the interposer body 12 is made of a ceramic material, such as silicon, which can be easily worked into the desired shape and configuration using silicon micromachining or other suitable processes. For most applications, the semiconductor die 50 will be rectangular, and the corresponding interposer body 12 may likewise be generally rectangular and about the same size as the die 50, as well a being generally wafer-like (i.e., having a thickness much smaller than its length and width).

The contact pads 18 are arranged about the periphery of the contact surface 14 in matched relation with the respective bond pads 54 of the semiconductor die 50. This leaves a central, usually rectangular area in the middle of the contact surface 14 which is free from contact pads; this pad-free area generally corresponds to the IC portion 52 of the semiconductor die. The bonding pads 20, on the other hand, are not arranged merely about the periphery of its surface 16 as are the contact pads; rather, the bonding pads 20 are arranged generally across the entire area of the bonding surface 16. This use of essentially the entire bottom surface 16 of the interposer provides a much larger area within which the pads may be distributed than is the case with using only a narrow perimeter area. This allows the use of bonding pads 20 that are appreciably larger than the interposer's contact pads 18.

Also provided within the interposer body 12 is a plurality of electrically conductive conduits 22, each connecting at least one contact pad 18 with at least one bonding pad 20. These conduits 22 are preferably formed as plated through-holes or vias (i.e., holes that are machined, etched, or otherwise formed in the interposer, which are then selectively plated or coated with copper or other conductive material). A small circuit trace or extension may extend along the top and bottom surfaces 14/16 connecting the top and bottom portion of each conduit/via with its respective contact pad 18 or bonding pad 20, respectively.

The interposer 10 may also include: a sealed cooling channel 28 defined within the interposer body 12; a fluid medium 30 generally filling the cooling channel 28; and a piezoelectric element 26 attached to the interposer body such that the piezoelectric element communicates with the cooling channel 28 and the fluid medium 30. The cooling channel 28 may be formed in the interposer body 12 by silicon micromachining or other suitable processes. The interposer may optionally include two or more cooling channels 28. Whatever number of channels 28 are provided, two criteria should be met in order to maximize the effectiveness of the cooling channels: (1) each channel 28 should be sealed and preferably completely filled with the fluid medium 30, and (2) each channel 28 should extend along a majority (i.e., >50%) of the length and/or width of the interposer body (and preferably along substantially all of the length and/or width).

The piezoelectric element 26 should be positioned with respect to the interposer body such that the element 26 is operatively coupled to at least two of the bonding pads $20_P$, preferably by connection with their respective conduits $22_P$. These two pads $20_P$ electrically connect the piezoelectric element 26 to the substrate circuit. When the element 26 is electrically pulsed by the substrate circuit, the element 26 vibrates at a given frequency; with proper selection of the element size, element placement with respect to the channel, cooling channel dimensions, fluid medium, element vibration frequency, etc., a standing wave will be generated within the fluid medium. This standing wave causes the fluid medium 30 to move about within the cooling channel 28, which in turn facilitates more homogeneous heat transfer within the channel. Thus, heat from any high heat-producing points within the interposer/die is more evenly distributed within the cooling channel, so that "hot spots" are avoided, thereby protecting the delicate IC devices of the die from thermal damage.

The frequency of the standing wave is governed by the equation:

$$f=v/2L$$

where f is the frequency, v is the velocity of wave propagation in the fluid medium, and L is the distance between the piezoelectric device at one end of the cooling channel and the far (reflecting) wall of the channel. For most applications, v will fall within the range of 900 to 1600 meters-per-second, and L will fall within the range of 40 to 250 mils (i.e., 0.040 to 0.250 inch). For example, using L=50 mils and v=1000 m/s, a frequency f of about 400 kHz. A reasonable range of frequencies for the present invention would be about 40 to 500 kHz.

A process for making and using the interposer 10 is as follows. First, silicon micromachining may be used to fabricate a two-piece interposer body as illustrated in FIGS. 8A–B, comprising a top half $12_T$ and a mating bottom half $12_B$. Constructing the interposer using this two-piece approach facilitates forming of the cooling channels 28 and conduit through-holes in the two halves. Preferably, a first silicon wafer is micromachined to form a plurality of top halves $12_T$, and a second silicon wafer is micromachined to form a plurality of respective bottom halves $12_B$; this is the preferred approach for such interposers as shown in FIGS. 6–8, but for such interposers as shown in FIG. 5 it may be preferable to fabricate interposers one-at-a-time rather than many-at-a-time on a wafer.

Second, the electrically conductive conduits 22 are formed. This may be accomplished, for example, by force-filling the machined through-holes in each interposer half with silver paste, gold paste, or the like (preferably using a noble metal paste) and then firing the paste-filled interposer halves at a temperature high enough to melt the paste and form solid metal conduits within the through-holes.

Third, the first and second wafers are aligned and adhered together (e.g., by anodic welding) so that each interposer top half $12_T$ is aligned with and adhered atop its respective bottom half $12_B$. (Optionally, the second step above may include only the step of filling the through-holes with paste, with the high-temperature firing step being reserved until after the third step—i.e., after the top and bottom interposer halves have been joined.)

Fourth, the interpose contact pads 18 and bonding pads 20 are formed on the interposer body's contact surface 14 and bonding surface 16, respectively, preferably by sputtering a noble metal onto the desired pad sites.

Fifth, the first wafer/second wafer interposer sandwich is aligned with and attached to an entire wafer of ICs, such that the contact pads 18 of each interposer 10 are attached to the respective bond pads 54 of each die 50. Alternatively, the interposer wafer sandwich may be sawed into individual interposers 10, with each individual interposer then being attached to a respective IC die on the IC wafer. In either case, attachment may be made using anodic welding, gold-to-gold thermocompression bonding, or a Z-axis-collapsing adhesive.

Sixth, a "ball transfer" process may be used to add pre-made solder balls 24 onto the interposer bonding pads 20. This process is similar to that used to add solder balls to BGA (ball grid array) packages, wherein: (1) the solder balls for each interposer are provided in a predetermined layout (corresponding to the bonding pad pattern) on a paper-like carrier, (2) flux is applied to the bonding pads 20, (3) the paper carrier is brought proximate the interposer such that the solder balls contact the bonding pads and stick thereto due to the flux, and (4) the assembly is subjected to a low-temperature reflow process so that the solder balls melt, wet onto their respective pads 20, and solidify in place thereon. (During reflow, the paper carrier "floats" upon the molten solder balls and may be plucked away.) These solder balls 24 serve as interconnect metallizations which facilitate subsequent connection of the bonding pads 20 to the substrate mounting pads 72. Aside from solder balls, these interconnect metallizations 24 may alternatively comprise metal bumps formed by wire bumping, multi-layer plating deposits (e.g., layers of tungsten, titanium, palladium, etc.), or the like.

Seventh, the interposer top/interposer bottom/IC die triple-wafer sandwich is sawed in order to singulate the sandwich into individual dice assemblies. Each die assembly will comprise one or more individual IC dies 50 attached to an individual interposer 10.

Eighth, the cooling channels 28 are filled with the fluid medium 30. The fluid medium 30 is preferably a liquid, rather than a gas, preferably having a relatively low viscosity, relatively high heat capacity and conductivity, and preferably a boiling point above 160° C. For transient applications, a fluid could be used which has a lower boiling point (e.g., just below the maximum operating temperature of the die, say 125° C. to 150° C.) and a high latent heat of vaporization. This could provide circulational heat transfer during routine operation, and phase change protection during brief temperature excursions. In these cases, the fluid could be chosen from the family of "FLUORINERT" liquids from Minnesota Mining and Manufacturing Co. ("3M"), with the appropriate boiling point. For transient or non-transient applications, it may be suitable to use low melting point solders (e.g., Sn—Bi eutectic) as the fluid medium, provided that the solder tends to wet the surfaces of the channel. Thus, conduction will be the mode of transport below melting, and conduction and convection above melting. Phase change advantages would also be retained. This would be particularly beneficial if the die had non-homogeneous and intermittent (i.e., transient) heat sources that caused hot spots for short periods. The phase change effect would allow "smearing" of the local (transitory) temperature excursions, while allowing circulation above the melting temperature of the fluid medium.

Ninth, one or more piezoelectric elements 26 is attached to the interposer body 12, such that each element 26 communicates with (and seals against) one or more cooling channels 28 and the fluid 30 therein, while also being operatively connected to the aforementioned two bonding pads $20_P$ or conduits $22_P$. The element 26 may be attached to the interposer body 12 by solder reflow, an adhesive, or the like. Alternatively, a piezoelectric material may be sputtered onto each site where a piezo-element 26 is desired, thereby building up a piezo-element made of the sputtered-on piezoelectric material at each site.

One example of applying the present invention interposer to a semiconductor die is as follows. For a square semiconductor die 50 measuring 500 mils (i.e., 0.500 inch) on a side and having 160 perimeter bond pads 54, two 500-mil square pieces of silicon may be micromachined to form the top and bottom interposer body halves $12_T/12_B$, as in FIGS. 8A–B. The halves $12_T/12_B$ would include 160 vias and four parallel cooling channels 28, with each channel 28 measuring approximately 450 mils long with a 10-mil square cross-section. In the bottom interposer body half $12_B$, an opening 29 for each channel 28 would also be formed, generally in the middle of the outer major surface of the bottom half $12_B$. A 0.1-Watt piezo-element 26 measuring 50×50×2 mils may then be attached to the opening 29 of each channel. Each channel 28 may then be filled with an appropriate FLUORINERT fluid medium 30, and the two interposer halves $12_T/12_B$ bonded together to provide the final structure illustrated in FIGS. 7A–B.

In addition to the present invention enabling the use of a higher number of bond pads (and/or larger bond pads), experimental results also indicate that the addition of an acoustically cooled interposer according to the present invention can provide a 500% improvement in heat transfer coefficient as seen by the semiconductor die 50.

Various other modifications to the present invention may occur to those skilled in the art to which the present invention pertains. For example, the interposer 10 may optionally include two or more piezoelectric elements 26, with each element 26 communicating with one or more cooling channel 28 and the fluid 30 therewithin. Also, the steps given above for making and using the interposer may be rearranged and/or combined as desired. Furthermore, although reference has mainly been made to a "fluid" medium 30 within the cooling channels 28, it should be appreciated that medium 30 may not always be in a fluid state in all conditions; for example, as noted above, the medium 30 may be generally solid at operating temperatures below the melting point of the medium, while being generally "fluid" (liquid) only at temperatures at or above the medium's melting point. Moreover, it should be apparent that the present invention may not only be used to attach a flip-chip onto a rigid substrate (e.g., an FR-4 PCB), but may also be used to attach the flip-chip die to TAB (i.e., tape automated bonding) carriers, flex circuits, and the like. Other modifications not explicitly mentioned herein are also possible and within the scope of the present invention. It is the following claims, including all equivalents, which define the scope of the present invention.

What is claimed is:

1. An interposer for electrically coupling a semiconductor die to a substrate, comprising:
    an interposer body made of a dielectric material, said interposer body having a contact surface and an opposed bonding surface;
    a plurality of contact pads arranged about the periphery of said contact surface;
    a plurality of bonding pads arranged across generally the entire area of said bonding surface; and
    a plurality of electrically conductive conduits disposed generally within said interposer body, such that each conduit connects a respective one of said contact pads with a respective one of said bonding pads.

2. An interposer according to claim 1, wherein said dielectric material comprises silicon.

3. An interposer according to claim 1, wherein said bonding pads are larger than said contact pads.

4. An interposer according to claim 1, wherein said plurality of electrically conductive conduits comprise a plurality of plated through-holes.

5. An interposer according to claim 1, wherein said interposer body is generally rectangular and wafer-shaped.

6. An interposer according to claim 1, further comprising:
    a sealed cooling channel defined within said interposer body; and
    a fluid medium generally filling said cooling channel.

7. An interposer according to claim 6, wherein said cooling channel extends along a majority of a length and a width of said interposer body.

8. An interposer according to claim 6, further comprising a piezoelectric element attached to said interposer body such that said piezoelectric element communicates with said cooling channel and said fluid medium.

9. An interposer according to claim 8, wherein said piezoelectric element is operatively coupled to at least two of said electrically conductive conduits.

10. An interposer according to claim 1, further comprising a plurality of interconnect metallizations each attached to a respective one of said bonding pads.

11. An interposer according to claim 10, wherein each interconnect metallization comprises a solder ball, a metal bump, or a multi-layer plating deposit.

12. An interposer for electrically coupling a semiconductor die to a substrate, comprising:
    a generally rectangular, wafer-shaped interposer body made of a dielectric material, said interposer body having a contact surface and an opposed bonding surface;
    a plurality of contact pads arranged about the periphery of said contact surface;
    a plurality of bonding pads arranged across generally the entire area of said bonding surface;
    a plurality of interconnect metallizations each attached to a respective one of said bonding pads; and
    a plurality of electrically conductive conduits disposed generally within said interposer body, such that each conduit connects a respective one of said contact pads with a respective one of said bonding pads.

13. An interposer according to claim 12, wherein said dielectric material comprises silicon.

14. An interposer according to claim 12, wherein said bonding pads are larger than said contact pads.

15. An interposer according to claim 12, wherein said plurality of electrically conductive conduits comprise a plurality of plated through-holes.

16. An interposer according to claim 12, further comprising:
    a sealed cooling channel defined within said interposer body; and
    a fluid medium generally filling said cooling channel.

17. An interposer according to claim 16, wherein said cooling channel extends along a majority of a length and a width of said interposer body.

18. An interposer according to claim 16, further comprising a piezoelectric element attached to said interposer body such that said piezoelectric element communicates with said cooling channel and said fluid medium.

19. An interposer according to claim 18, wherein said piezoelectric element is operatively coupled to at least two of said electrically conductive conduits.

20. An interposer for electrically coupling a semiconductor die to a substrate, comprising:
    a generally rectangular, wafer-shaped interposer body made of silicon, said interposer body having a contact surface and an opposed bonding surface;
    a plurality of contact pads arranged about the periphery of said contact surface;
    a plurality of bonding pads arranged across generally the entire area of said bonding surface;
    a plurality of interconnect metallizations each attached to a respective one of said bonding pads;
    a plurality of electrically conductive conduits disposed generally within said interposer body, such that each conduit connects a respective one of said contact pads with a respective one of said bonding pads;
    a sealed cooling channel defined within said interposer body;
    a fluid medium generally filling said cooling channel; and
    a piezoelectric element attached to said interposer body such that said piezoelectric element communicates with said cooling channel and said fluid medium, said piezoelectric element being operatively coupled to at least two of said electrically conductive conduits.

* * * * *